(12) United States Patent
Walker

(10) Patent No.: US 7,145,483 B2
(45) Date of Patent: Dec. 5, 2006

(54) CHIP TO CHIP INTERFACE FOR ENCODING DATA AND CLOCK SIGNALS

(75) Inventor: Robert Walker, Raleigh, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/730,443

(22) Filed: Dec. 8, 2003

(65) Prior Publication Data

US 2005/0122239 A1    Jun. 9, 2005

(51) Int. Cl.
  *H03M 5/02* (2006.01)
(52) U.S. Cl. .......................... 341/56; 341/57
(58) Field of Classification Search .............. 341/56, 341/57, 55; 327/51; 714/712, 715; 365/222, 365/221, 233
See application file for complete search history.

(56) References Cited

U.S. PATENT DOCUMENTS

| | | | |
|---|---|---|---|
| 4,475,212 A | 10/1984 | McLean et al. | |
| 4,520,408 A | 5/1985 | Velasquez | |
| 4,592,072 A | 5/1986 | Stewart | |
| 4,888,791 A | 12/1989 | Barndt, Sr. | |
| 4,965,575 A | 10/1990 | Wash | |
| 5,550,864 A | 8/1996 | Toy et al. | |
| 5,912,928 A | 6/1999 | Chieco et al. | |
| 6,426,656 B1 * | 7/2002 | Dally et al. | 327/51 |
| 6,574,758 B1 * | 6/2003 | Eccles | 714/712 |

* cited by examiner

*Primary Examiner*—Rexford Barnie
*Assistant Examiner*—Lam T. Mai
(74) *Attorney, Agent, or Firm*—Dicke, Billig & Czaja, PLLC

(57) ABSTRACT

A chip to chip interface comprises a driver configured to receive a data signal and provide an output signal at a first level in response to receiving an odd number of consecutive logic highs in the data signal, at a second level in response to receiving an odd number of consecutive logic lows in the data signal, at a third level in response to receiving an even number of consecutive logic highs in the data signal and at a fourth level in response to receiving an even number of consecutive logic lows in the data signal.

21 Claims, 6 Drawing Sheets

CHIP TO CHIP INTERFACE FOR ENCODING DATA AND CLOCK SIGNALS

BACKGROUND

The need for high speed input/output (I/O) continues to increase as clock speeds increase. I/O transfers between chips on printed circuit boards (PCBs) are becoming increasingly fast. As clock speeds increase, high speed I/O becomes more difficult to realize due to shrinking bit times and set up and hold times not scaling well.

Typical I/O uses at least two lines to transfer data from one chip to another. One line is for the data signal and the other line is for a data strobe or data clock signal. Both the data signal and the data strobe or data clock signal are transmitted simultaneously from one chip to another through the two lines. At the receiving chip, the data strobe or data clock signal is used to latch in the data bits from the data signal. Skew between the data signal and the data strobe or data clock signal increases the difficulty of transmitting data at high speeds. Skew and other factors across the I/O can dramatically reduce the valid data eye to 50% or less of the data bit time.

In a typical data bus, the data line and the data strobe or data clock line must be routed precisely to avoid skew problems. Some designs need more data clock or data strobe lines as the data bus gets wider. I/O can also suffer from a lone pulse problem. A lone pulse problem occurs when there are a series of logic low data bits or a series of logic high data bits and at one point in the series a single bit having the opposite logic level is transmitted. When this occurs, the opposite logic level data bit can be missed as the logic level of the data line may have been pulled too high or too low by the preceding multiple logic high bits or multiple logic low bits. A single bit of the opposite logic level may not overcome the threshold logic level required to characterize the bit. These problems become more common and troublesome as I/O speeds increase.

SUMMARY

One embodiment of the present invention provides a chip to chip interface. The chip to chip interface comprises a driver configured to receive a data signal and provide an output signal at a first level in response to receiving an odd number of consecutive logic highs in the data signal, at a second level in response to receiving an odd number of consecutive logic lows in the data signal, at a third level in response to receiving an even number of consecutive logic highs in the data signal and at a fourth level in response to receiving an even number of consecutive logic lows in the data signal.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
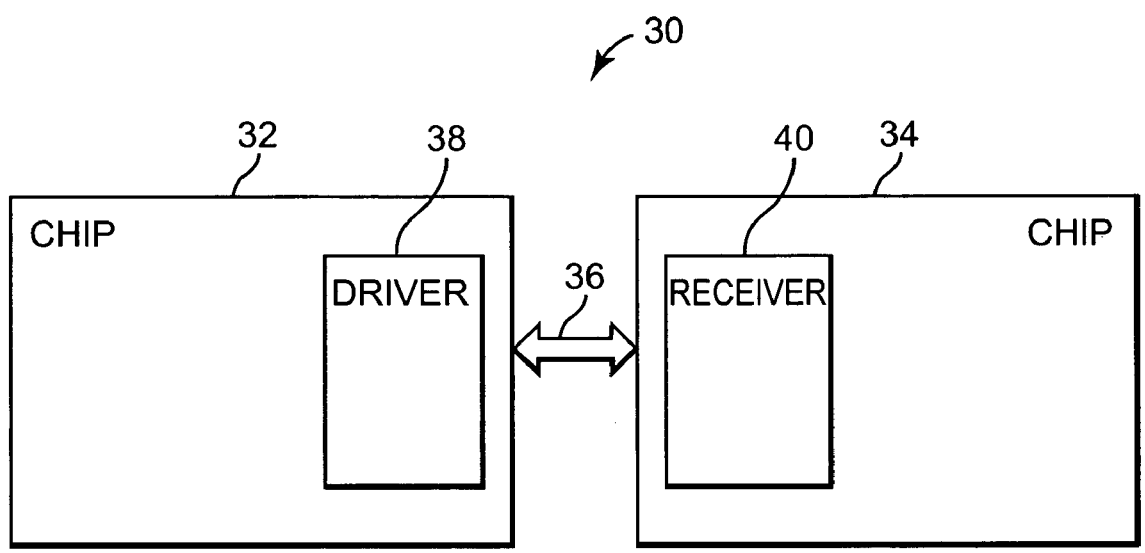
FIG. 1 is a block diagram illustrating one embodiment of a chip to chip interface.

FIG. 1 is a block diagram illustrating one embodiment of a chip to chip interface 30. Chip to chip interface 30 includes chip 32 and chip 34. Chip 32 is electrically coupled to chip 34 through communication link 36. Chip 32 includes driver 38 and chip 34 includes receiver 40. In one embodiment, chip 32 is a memory controller and chip 34 is a memory, such as a double data rate synchronous dynamic random access memory (DDR SDRAM). In other embodiments, chip 32 and chip 34 can be any two suitable chips that transmit signals between each other.

Driver 38 transmits signals to receiver 40 through communication link 36. In one embodiment, driver 38 receives a double data rate (DDR) data signal to transmit to receiver 40. The DDR data signal includes positive edge data aligned with positive edges of a clock signal and negative edge data aligned with negative edges of the clock signal. The positive edge data is referred to as even data and the negative edge data is referred to as odd data.

Communication link 36 includes one or more signal lines. Driver 38 transmits signals to receiver 40 through communication link 36 by providing an encoded signal comprising clock signal information and DDR data signal information. Driver 38 drives the encoded signal to one of four reference levels in response to the DDR data signal. Driver 38 drives the encoded signal to a first reference level in response to a transition from a logic low to a logic high in the DDR data signal. Driver 38 drives the encoded signal to a second reference level in response to a transition from a logic high to a logic low in the DDR data signal. Driver 38 drives the encoded signal to a third reference level in response to two consecutive logic highs in the DDR data signal. Driver 38 alternately drives the encoded signal between the first and third reference levels in response to more than two consecutive logic highs in the DDR data signal. Driver 38 drives the encoded signal to a fourth reference level in response to two consecutive logic lows in the DDR data signal. Driver 38 alternately drives the encoded signal between the second and fourth reference levels in response to more than two consecutive logic lows in the DDR data signal. A transition between reference levels in the encoded signal occurs at each edge of the clock signal for each bit in the DDR data signal.

Receiver 40 receives the encoded signal and compares the encoded signal to four reference levels to decode the DDR data signal. In addition, each transition between reference levels in the encoded signal toggles a data clock signal to create the clock signal in receiver 40. The clock signal latches the data from the DDR data signal into receiver 40. In one embodiment, the clock signal is a 500 MHz clock signal and the DDR data signal is a 1 GHz DDR data signal.

Figure 2:
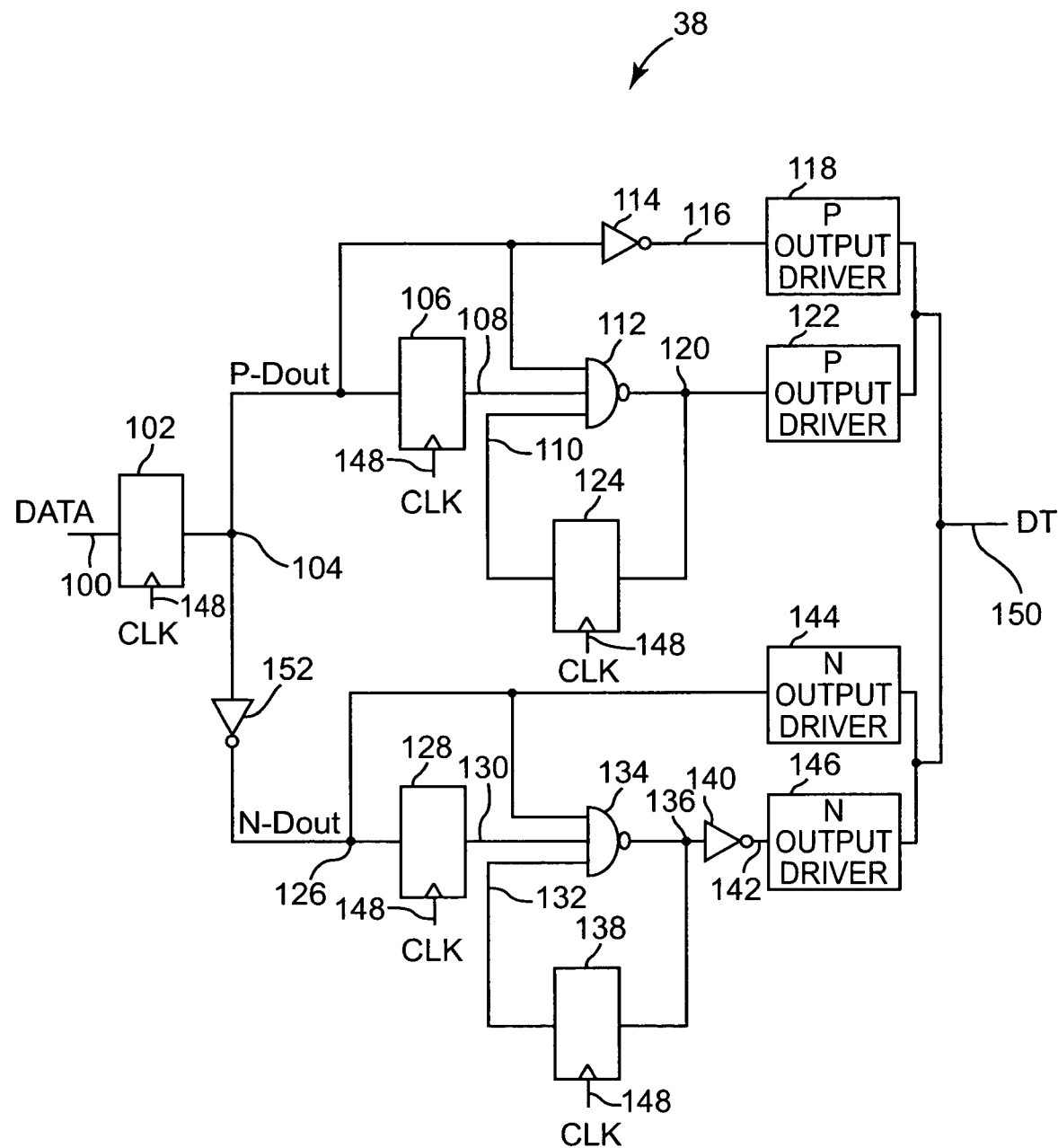
FIG. 2 is a diagram illustrating one embodiment of a driver for the chip to chip interface.

FIG. 2 is a diagram illustrating one embodiment of driver 38. Driver 38 includes flip-flops 102, 106, 124, 128, and 138, inverters 114, 152, and 140, NAND gates 112 and 134, P output drivers 118 and 122, and N output drivers 144 and 146. In one embodiment, flip-flops 102, 106, 124, 128, and 138 are double edge triggered D-type flip-flops or other suitable latches. In one embodiment, P output drivers 118 and 122 comprise p-channel metal oxide semiconductor (PMOS) field effect transistors (FETs) and N output drivers 144 and 146 comprise n-channel metal oxide semiconductor (NMOS) FETs. In other embodiments, other suitable drivers can be used.

Input DATA signal path 100 is electrically coupled to the data input of flip-flop 102. The output of flip-flop 102 is electrically coupled to the input of inverter 114, an input of NAND gate 112, the data input of flip-flop 106, and the input of inverter 152 through P data out (P-Dout) signal path 104. The output of flip-flop 106 is electrically coupled to an input of NAND gate 112 through signal path 108 and the output of inverter 114 is electrically coupled to the input of P output driver 118 through signal path 116. The output of NAND gate 112 is electrically coupled to the input of P output driver 122 and the data input of flip-flop 124 through signal path 120. The output of flip-flop 124 is electrically coupled to an input of NAND gate 112 through signal path 110.

The output of inverter 152 is electrically coupled to the data input of flip-flop 128, the input of N output driver 144, and to an input of NAND gate 134 through N data out (N-Dout) signal path 126. The output of flip-flop 128 is electrically coupled to an input of NAND gate 134 through signal path 130. The output of NAND gate 134 is electrically coupled to the input of inverter 140 and the data input of flip-flop 138 through signal path 136. The output of flip-flop 138 is electrically coupled to an input of NAND gate 134 through signal path 132. The output of inverter 140 is electrically coupled to the input of N output driver 146 through signal path 142. The outputs of N output driver 144, N output driver 146, P output driver 118, and P output driver 122 are electrically coupled to data transmitter (DT) signal path 150. DT signal path 150 is one signal path in communication link 36. Clock (CLK) signal path 148 is electrically coupled to the clock inputs of flip-flops 102, 106, 124, 128, and 138.

A DDR data signal DATA is input to flip-flop 102. Flip-flop 102 latches in the even data in the DATA signal on each positive transition of the CLK signal and latches in the odd data in the DATA signal on each negative transition of the CLK signal. Flip-flop 102 outputs the P-Dout signal to inverter 114, flip-flop 106, NAND gate 112, and inverter 152. Flip-flop 106 receives the P-Dout signal from flip-flop 102 and latches in the P-Dout signal on each transition of the CLK signal. Flip-flop 124 latches in the output of NAND gate 112 on each transition of the CLK signal.

Inverter 114 inverts the P-Dout signal and outputs the inverted P-Dout signal to P output driver 118. P output driver 118 receives the output signal from inverter 114. If the output signal from inverter 114 is logic low, P output driver 118 drives the DT signal on signal path 150 to a high reference voltage (DHREF). If the output signal from inverter 114 is logic high, P output driver 118 is turned off. P output driver 122 receives the output signal from NAND gate 112. If the output signal from NAND gate 112 is logic low, P output driver 122 drives the DT signal to a double high reference voltage (DHHREF) that is greater than DHREF. If the output signal from NAND gate 112 is logic high, P output driver 122 is turned off.

To begin operation, flip-flops 102, 106, 124, 128, and 138 are reset to output logic lows. The logic low outputs from flip-flops 106 and 124 set the NAND gate 112 to output a logic high to turn off P output driver 122. The logic low output from flip-flip 102 sets the output of inverter 114 to a logic high to turn off P output driver 118. At the first edge of the CLK signal, flip-flop 106 latches in a logic low and flip-flop 124 latches in a logic high. The output of NAND gate 112 remains at a logic high due to the logic low output of flip-flop 106. If the DATA signal on signal path 100 is at a logic high, the first edge of the CLK signal latches a logic high into flip-flop 102 as P-Dout on signal path 104. Inverter 114 outputs a logic low to turn on P output driver 118 and supply the high reference voltage DHREF on DT signal path 150.

At the second edge of the CLK signal, flip-flops 106 and 124 latch in logic highs. If the DATA signal on signal path 100 remains at a logic high, the second edge of the CLK signal latches a logic high into flip-flop 102 as P-Dout on signal path 104. Inverter 114 outputs a logic low to turn on P output driver 118. In addition, with each of the inputs of NAND gate 112 at a logic high, NAND gate 112 outputs a logic low to turn on P output driver 122. With P output driver 118 and 122 turned on, the DT signal is set to the double high reference voltage VHHREF.

If P-Dout is a logic high and the output of flip-flop 106 is a logic high and the output of flip-flop 124 is a logic high, the output of NAND gate 112 is a logic low and P output driver 122 turns on. If P-Dout remains at a logic high at the next edge of the CLK signal, flip-flop 124 latches in a logic low and outputs a logic low to NAND gate 112. The output of NAND gate 112 transitions to a logic high and P output driver 122 turns off. If P-Dout remains at a logic high at the next edge of the CLK signal, flip-flop 124 latches in a logic high and outputs a logic high to NAND gate 112. The output of NAND gate 112 transitions to a logic low and P output driver 122 turns on. P output driver 122 alternately cycles on and off at each transition of the CLK signal as long as P-Dout remains at a logic high, i.e. as long as DATA remains at a logic high.

Flip-flop 128 receives the N-Dout signal from inverter 152. Flip-flop 128 latches in the N-Dout signal on signal path 126 on each transition of the CLK signal. Flip-flop 138 latches in the output of NAND gate 134 on each transition of the CLK signal. N output driver 144 receives the N-Dout signal from inverter 152. If the N-Dout signal is a logic high, N output driver 144 drives the DT signal on signal path 150 to a low reference voltage (DLREF) that is less than DHREF. If the N-Dout signal is a logic low, N output driver 144 is turned off. N output driver 146 receives the output signal from inverter 140. If the output signal from inverter 140 is a logic high, N output driver 146 drives the DT signal to a double low reference voltage (DLLREF) that is less than DLREF. If the output signal from inverter 140 is a logic low, N output driver 146 is turned off.

To begin operation, flip-flops 102, 106, 124, 128, and 138 are reset to output logic lows. The logic low outputs from flip-flops 128 and 138 set the output of NAND gate 134 to a logic high the output of inverter 140 to a logic low. The logic low output signal from inverter 140 turns off N output driver 146. The logic low output signal from flip-flop 102 sets the output of inverter 152 to a logic high that turns on N output driver 144 to drive the DT signal on signal path 150 to the low reference voltage VLREF.

At the first edge of the CLK signal, flip-flop 128 latches in a logic high and flip-flop 138 latches in a logic high signal. If the DATA signal on signal path 100 is at a logic low, the first edge of the CLK signal latches a logic low into flip-flop 102. The output of inverter 152 remains at a logic high and N output driver 144 remains turned on. In addition, with each of the inputs of NAND gate 134 at a logic high, NAND gate 134 supplies a logic low to inverter 140. Inverter 140 supplies a logic high level to turn on N output driver 146.

With N output drivers 144 and 146 turned on, the DT signal is set to the double low reference voltage VLLREF.

If N-Dout is a logic high and the output of flip-flop 128 is a logic high and the output of flip-flop 138 is a logic high, the output of NAND gate 134 is a logic low. The logic low output of NAND gate 134 is inverted by inverter 140 to a logic high and N output driver 146 is turned on. If N-Dout remains at a logic high at the next edge of the CLK signal, flip-flop 138 latches in a logic low and outputs a logic low to NAND gate 134. The output of NAND gate 134 transitions to a logic high. The logic high output of NAND gate 134 is inverted by inverter 140 to a logic low and N output driver 146 is turned off. If N-Dout remains at a logic high at the next edge of the CLK signal, flip-flop 138 latches in a logic high and outputs a logic high to NAND gate 134. The output of NAND gate 134 transitions to a logic low. The logic low output of NAND gate 134 is inverted by inverter 140 to a logic high and N output driver 146 is turned on. N output driver 146 alternately cycles on and off at each transition of the CLK signal as long as N-Dout remains at a logic high, i.e. as long as DATA remains logic low.

In operation, a DDR data signal is input to flip-flop 102 on signal path 100. The positive edge data of the DDR data signal is latched in on the positive edges of the CLK signal and the negative edge data of the DDR data signal is latched in on the negative edges of the CLK signal. The P-Dout signal is output on signal path 104. If the P-Dout signal on signal path 104 is a logic high, P output driver 118 or P output driver 118 and P output driver 122 are turned on. Also, N output driver 144 and N output driver 146 are turned off. If the P-Dout signal on signal path 104 is a logic low, N output driver 144 or N output driver 144 and N output driver 146 are turned on. Also, P output driver 118 and P output driver 122 are turned off.

If the P-Dout signal is a logic high, and the previous P-Dout signal was a logic low, P output driver 118 is turned on and P output driver 122 is turned off. If the P-Dout signal is a logic high and the previous P-Dout signal was a logic high, P output driver 118 is turned on and P output driver 122 alternately cycles on and off at each transition of the CLK signal as long as P-Dout remains at a logic high.

If the N-Dout signal is a logic high, and the previous N-Dout signal was a logic low, N output driver 144 is turned on and N output driver 146 is turned off. If the N-Dout signal is a logic high and the previous N-Dout signal was a logic high, N output driver 144 is turned on and N output driver 146 alternately cycles on and off at each transition of the CLK signal as long as N-Dout remains at a logic high.

Figure 3:
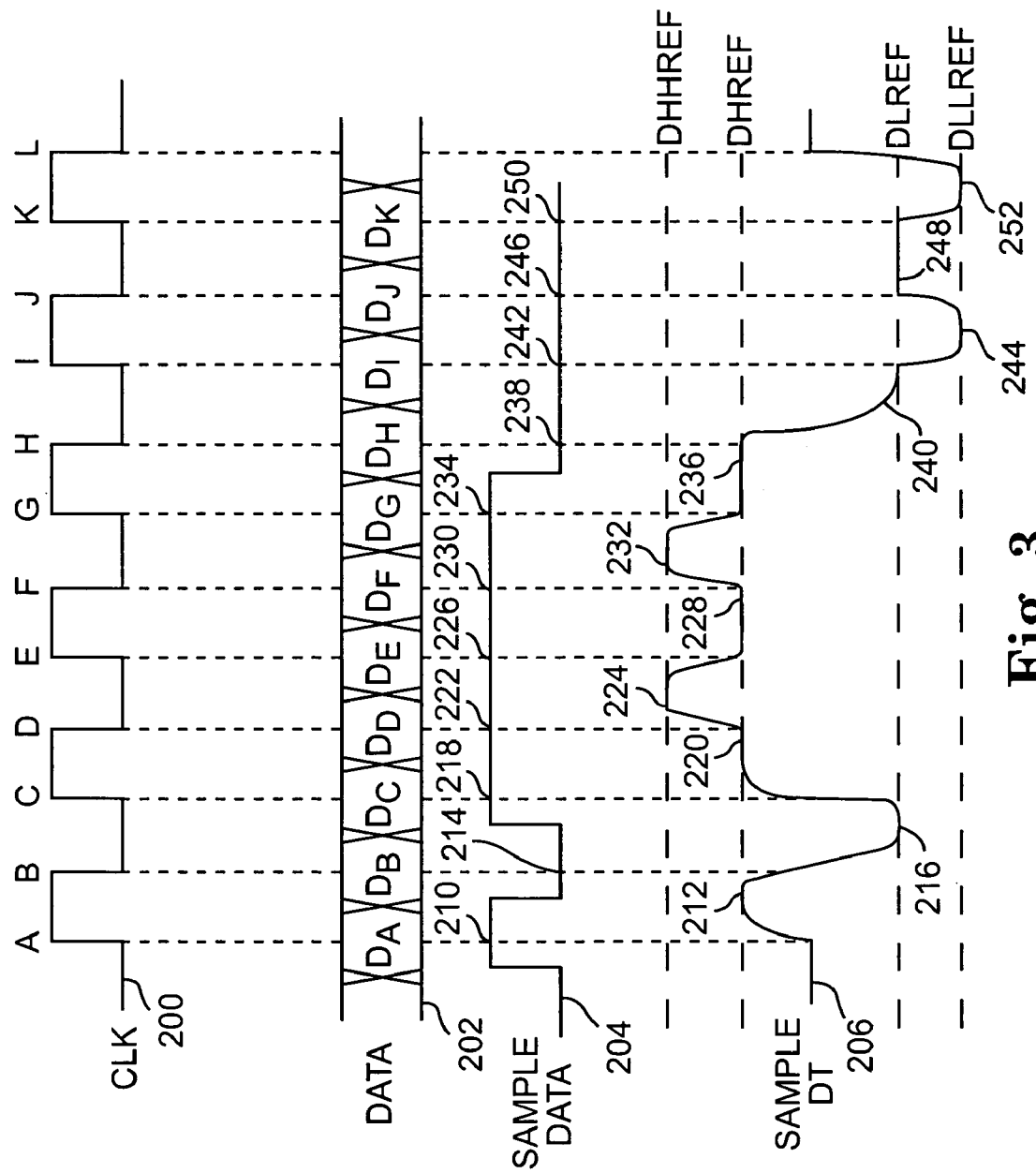
FIG. 3 is a timing diagram illustrating the timing of signals for the driver for the chip to chip interface.

FIG. 3 is a timing diagram illustrating the timing of signals for driver 38. The timing diagram illustrates CLK signal 200 on signal path 148, DATA signal 202 on signal path 100, sample data signal 204 for input on signal path 100, and sample data transmitted (DT) signal 206 on signal path 150. CLK signal 200 includes clock edges A–L. DATA signal 202 is a DDR data signal including data $D_A$–$D_K$. On the rising edge of CLK signal 200 at A, data $D_A$ is latched into flip-flop 102. On the falling edge of CLK signal 200 at B, data $D_B$ is latched into flip-flop 102. On the rising edge of CLK signal 200 at C, data $D_C$ is latched into flip-flop 102, and so on, up to on the rising edge of CLK signal 200 at K, data $D_K$ is latched into flip-flop 102.

Sample data signal 204 illustrates an example of a DDR data signal on signal path 100. Sample data signal 204 includes $D_A$=logic high, $D_B$=logic low, $D_C$–$D_G$=logic high, and $D_H$–$D_K$=logic low. As sample data signal 204 is input to driver 38 on signal path 100, sample DT signal 206 is output from driver 38 on signal path 150.

At CLK signal edge A, logic high $D_A$ of sample data signal 204 is latched into flip-flop 102 at 210. The logic high P-Dout signal is inverted to logic low by inverter 114 to turn on P output driver 118. Sample DT signal 206 is pulled to DHREF at 212 for a half cycle of CLK signal 200 between CLK signal edges A and B.

At CLK signal edge B, logic low $D_B$ is latched into flip-flop 102 at 214. The logic low P-Dout signal turns off P output driver 118 and turns on N output driver 144. Sample DT signal 206 is pulled to DLREF at 216 for a half cycle of CLK signal 200 between CLK signal edges B and C.

At CLK signal edge C, logic high $D_C$ is latched into flip-flop 102 at 218. The logic high P-Dout signal turns off N output driver 144 and turns on P output driver 118. Sample DT signal 206 is pulled to DHREF at 220 for a half cycle of CLK signal 200 between CLK signal edges C and D.

At CLK signal edge D, logic high $D_D$ is latched into flip-flop 102 at 222. In addition flip-flop 106 latches in a logic high from the previous P-Dout signal and flip-flop 124 latches in a logic high from the output of NAND gate 112. The logic high P-Dout signal is inverted by inverter 114 to a logic low that turns on P output driver 118. With each of the inputs of NAND gate 112 at a logic high, NAND gate 112 outputs a logic low to turn on P output driver 122. The logic high P-Dout signal is inverted by inverter 114 to a logic low that turns on P output driver 118. Sample DT signal 206 is pulled to DHHREF at 224 for a half cycle of CLK signal 200 between CLK signal edges D and E.

At CLK signal edge E, logic high $D_E$ is latched into flip-flop 102 at 226. In addition, flip-flop 106 latches in a logic high from the previous P-Dout signal and flip-flop 124 latches in a logic low from the output of NAND gate 112. The output of NAND gate 112 switches to a logic high to turn off P output driver 122. The logic high P-Dout signal is inverted by inverter 114 to a logic low that turns on P output driver 118. Sample DT signal 206 is pulled to DHREF at 228 for a half cycle of CLK signal 200 between CLK signal edges E and F.

At CLK signal edge F, logic high $D_F$ is latched into flip-flop 102 at 230. The output of inverter 114 remains at a logic low to turn on P output driver 118. The output of NAND gate 112 switches to a logic low to turn on P output driver 122. Sample DT signal 206 is pulled to DHHREF at 232 for a half cycle of CLK signal 200 between CLK signal edges F and G.

At CLK signal edge G, logic high $D_G$ is latched into flip-flop 102 at 234. The output of inverter 114 remains at a logic low to turn on P output driver 118. The output of NAND gate 112 switches to a logic high to turn off P output driver 122. Sample DT signal 206 is pulled to DHREF at 236 for a half cycle of CLK signal 200 between CLK signal edges G and H.

At CLK signal edge H, logic low $D_H$ is latched into flip-flop 102 at 238. In addition, flip-flop 128 latches in a logic low from the previous N-Dout signal and flip-flop 138 latches in a logic high from the output of NAND gate 134. The logic low P-Dout signal is inverted to logic high by inverter 114 that turns off P output driver 118. The logic low P-Dout signal is inverted to a logic high N-Dout signal by inverter 152 that turns on N output driver 144. Sample DT signal 206 is pulled to DLREF at 240 for a half cycle of CLK signal 200 between CLK signal edges H and I.

At CLK signal edge I, logic low $D_I$ is latched into flip-flop 102 at 242. In addition, flip-flop 128 latches in a logic high from the previous N-Dout signal and flip-flop 138 latches in a logic high from the output of NAND gate 134. With each input of NAND gate 134 at a logic high, NAND gate 134 outputs a logic low. The logic low output from NAND gate 134 is inverted to a logic high by inverter 140 to turn on N output driver 146. The logic high N-Dout signal turns on N output driver 144. Sample DT signal 206 is pulled to DLLREF at 244 for a half cycle of CLK signal 200 between CLK signal edges I and J.

At CLK signal edge J, logic low $D_J$ is latched into flip-flop 102 at 246. In addition, flip-flop 128 latches in a logic high from the previous N-Dout signal and flip-flop 138 latches in a logic low from the output of NAND gate 134. The output of NAND gate 134 switches to a logic high. The logic high output of NAND gate 134 is inverted to a logic low by inverter 140 to turn off N output driver 146. The N-Dout signal remains at a logic high to turn on N output driver 144. Sample DT signal 206 is pulled to DLREF at 248 for a half cycle of CLK signal 200 between CLK signal edges J and K.

At CLK signal edge K, logic $D_K$ is latched into flip-flop 102 at 250. N-Dout remains at a logic high to turn on N output driver 144. The output of NAND gate 134 switches to a logic low. The logic low output of NAND gate 134 is inverted by inverter 140 to turn on N output driver 146. Sample DT signal 206 is pulled to DLLREF at 252 for a half cycle of CLK signal 200 between CLK signal edges K and L.

Figure 4:
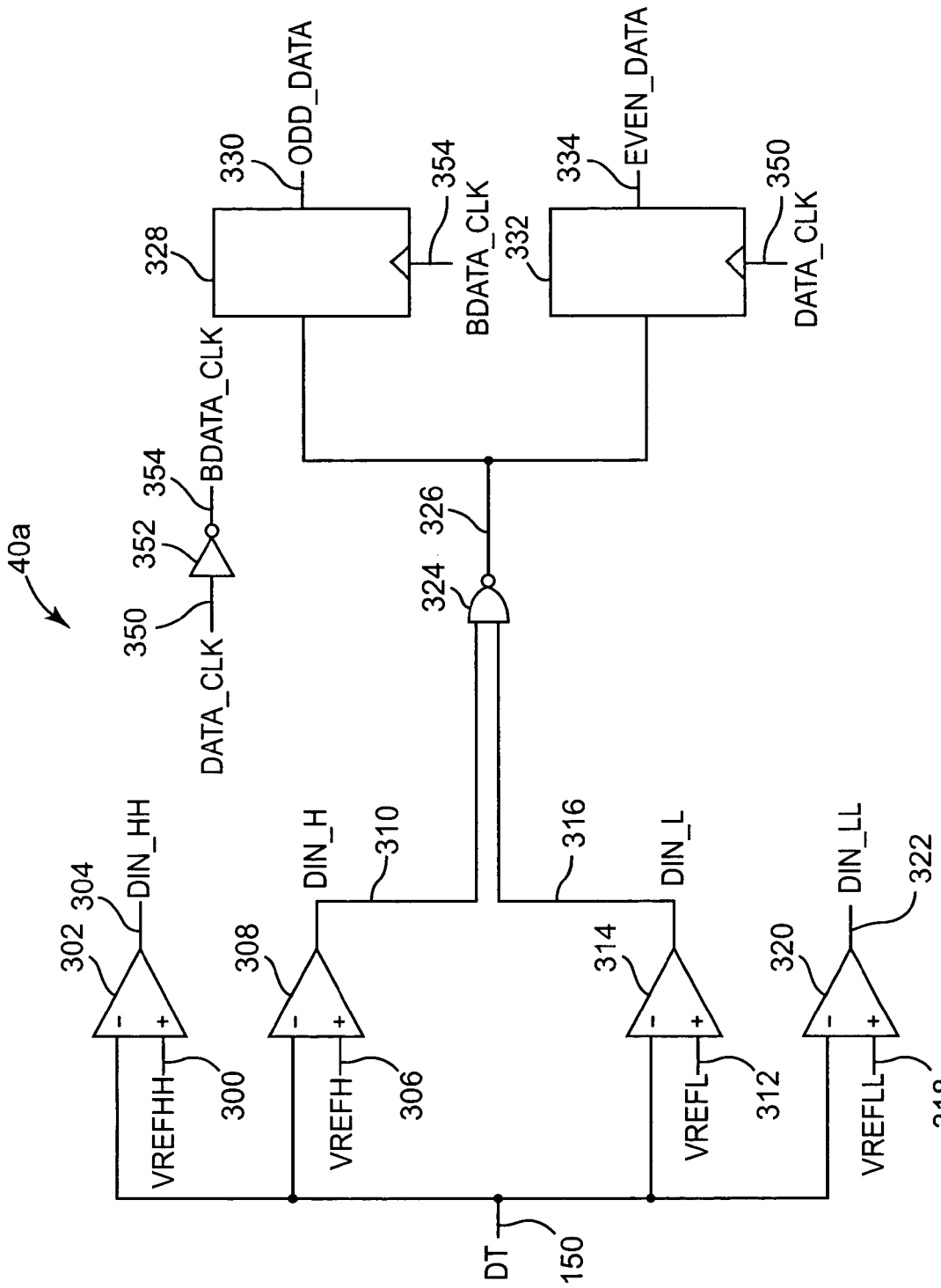
FIG. 4 is a diagram illustrating one embodiment of a portion of a receiver for decoding the data signal in the chip to chip interface.

FIG. 4 is a diagram illustrating one embodiment of a portion 40a of receiver 40 for decoding the data signal. The portion 40a of receiver 40 includes operational amplifiers (op amps) 302, 308, 314, and 320, NAND gate 324, flip-flops 328 and 332, and inverter 352. In one embodiment, flip-flops 328 and 332 are positive edge triggered D-type flip-flops or other suitable latches.

DT signal path 150 is electrically coupled to the negative inputs of op amps 302, 308, 314, and 320. The positive input of op amp 302 is electrically coupled to VREFHH signal path 300 and the output of op amp 302 is electrically coupled to DIN_HH signal path 304. The positive input of op amp 308 is electrically coupled to VREFH signal path 306 and the output of op amp 308 is electrically coupled to the first input of NAND gate 324 through DIN_H signal path 310. The positive input of op amp 314 is electrically coupled to VREFL signal path 312 and the output of op amp 314 is electrically coupled to the second input of NAND gate 324 through DIN_L signal path 316. The positive input of op amp 320 is electrically coupled to VREFLL signal path 318 and the output of op amp 320 is electrically coupled to DIN_L signal path 322.

The output of NAND gate 324 is electrically coupled to the inputs of flip-flops 328 and 332 through signal path 326. The output of flip-flop 328 is electrically coupled to ODD_DATA signal path 330. The output of flip-flop 332 is electrically coupled to EVEN_DATA signal path 334. DATA_CLK signal path 350 is electrically coupled to the input of inverter 352 and the clock input of flip-flop 332. The output of inverter 352 is electrically coupled to BDATA_CLK signal path 354 that is electrically coupled to the clock input of flip-flop 328.

Op amp 302 operates as a comparator and receives the DT and VREFHH signals as inputs. In one embodiment, VREFHH is a constant voltage signal greater than the termination voltage of signal path 150 and less than DHHREF. If the voltage of the DT signal is greater than the voltage of the VREFHH signal, the output DIN_HH signal is a logic low. If the voltage of the DT signal is less than the voltage of the VREFHH signal, the output DIN_HH signal is a logic high.

Op amp 308 operates as a comparator and receives the DT and VREFH signals as inputs. In one embodiment, VREFH is a constant voltage signal greater than the termination voltage of signal path 150 and less than DHREF and VREFHH. If the voltage of the DT signal is greater than the voltage of the VREFH signal, the output DIN_H signal is a logic low. If the voltage of the DT signal is less than the voltage of the VREFH signal, the output DIN_H signal is a logic high.

Op amp 314 operates as a comparator and receives the DT and VREFL signals as inputs. In one embodiment, VREFL is a constant voltage signal less than the termination voltage of signal path 150 and greater than DLREF. If the voltage of the DT signal is greater than the voltage of the VREFL signal, the output DIN_L signal is a logic low. If the voltage of the DT signal is less than the voltage of the VREFL signal, the output DIN_L signal is a logic high.

Op amp 320 operates as a comparator and receives the DT and VREFLL signals as inputs. In one embodiment, VREFLL is a constant voltage signal less than the termination voltage of signal path 150, greater than DLLREF, and less than VREFL. If the voltage of the DT signal is greater than the voltage of the VREFLL signal, the output DIN_LL signal is a logic low. If the voltage of the DT signal is less than the voltage of the VREFLL signal, the output DIN_LL signal is a logic high.

To begin, flip-flops 328 and 332 are reset to output logic lows. NAND gate 324 receives the DIN_H and DIN_L signals from op amps 308 and 314 as inputs and outputs a signal to flip-flops 328 and 332. If DIN_H and DIN_L are both logic high, the output of NAND gate 324 is a logic low. If one or both DIN_H and DIN_L are logic low, the output of NAND gate 324 is a logic high. A logic high output from NAND gate 324 indicates a logic high bit in the DDR data signal and a logic low output from NAND gate 324 indicates a logic low bit in the DDR data signal.

The DATA_CLK signal is inverted by inverter 352 to provide the BDATA_CLK signal. The generation of the DATA_CLK signal is described with reference to FIG. 5. On each positive edge of the BDATA_CLK signal, the output of NAND gate 324 is latched into flip-flop 328. Flip-flop 328 outputs the odd data from the DDR data signal to other circuits in chip 34 through ODD_DATA signal path 330. On each positive edge of the DATA_CLK signal, the output of NAND gate 324 is latched into flip-flop 332. Flip-flop 332 outputs the even data from the DDR data signal to other circuits in chip 34 through EVEN_DATA signal path 334.

If the DT signal on signal path 150 is at DHHREF, the DIN_HH signal is a logic low, the DIN_H signal is a logic low, the DIN_L signal is a logic low, and the DIN_LL signal is a logic low. With a logic low DIN_H signal and a logic low DIN_L signal, the output of NAND gate 324 is a logic high. The logic high output of NAND gate 324 is latched into flip-flop 328 on the positive edge of the BDATA_CLK signal to provide the ODD_DATA signal. The logic high output of NAND gate 324 is latched into flip-flop 332 on the positive edge of the DATA_CLK signal to provide the EVEN_DATA signal.

If the DT signal on signal path 150 is at DHREF, the DIN_HH signal is a logic high, the DIN_H signal is a logic low, the DIN_L signal is a logic low, and the DIN_LL signal is a logic low. With a logic low DIN_H signal and a logic low DIN_L signal, the output of NAND gate 324 is a logic high. The logic high output of NAND gate 324 is latched into flip-flop 328 on the positive edge of the BDATA_CLK signal to provide the ODD_DATA signal. The logic high output of NAND gate 324 is latched into flip-flop 332 on the positive edge of the DATA_CLK signal to provide the EVEN_DATA signal.

If the DT signal on signal path 150 is at DLREF, the DIN_HH signal is a logic high, the DIN_H signal is a logic high, the DIN_L signal is a logic high, and the DIN_LL signal is a logic low. With a logic high DIN_H signal and a logic high DIN_L signal, the output of NAND gate 324 is a logic low. The logic low output of NAND gate 324 is latched into flip-flop 328 on the positive edge of the BDATA_CLK signal to provide the ODD_DATA signal. The logic high output of NAND gate 324 is latched into flip-flop 332 on the positive edge of the DATA_CLK signal to provide the EVEN_DATA signal.

If the DT signal on signal path 150 is at DLLREF, the DIN_HH signal is a logic high, the DIN_H signal is a logic high, the DIN_L signal is a logic high, and the DIN_LL signal is a logic high. With a logic high DIN_H signal and a logic high DIN_L signal, the output of NAND gate 324 is a logic low. The logic low output of NAND gate 324 is latched into flip-flop 328 on the positive edge of the BDATA_CLK signal to provide the ODD_DATA signal. The logic high output of NAND gate 324 is latched into flip-flop 332 on the positive edge of the DATA_CLK signal to provide the EVEN_DATA signal.

Figure 5:
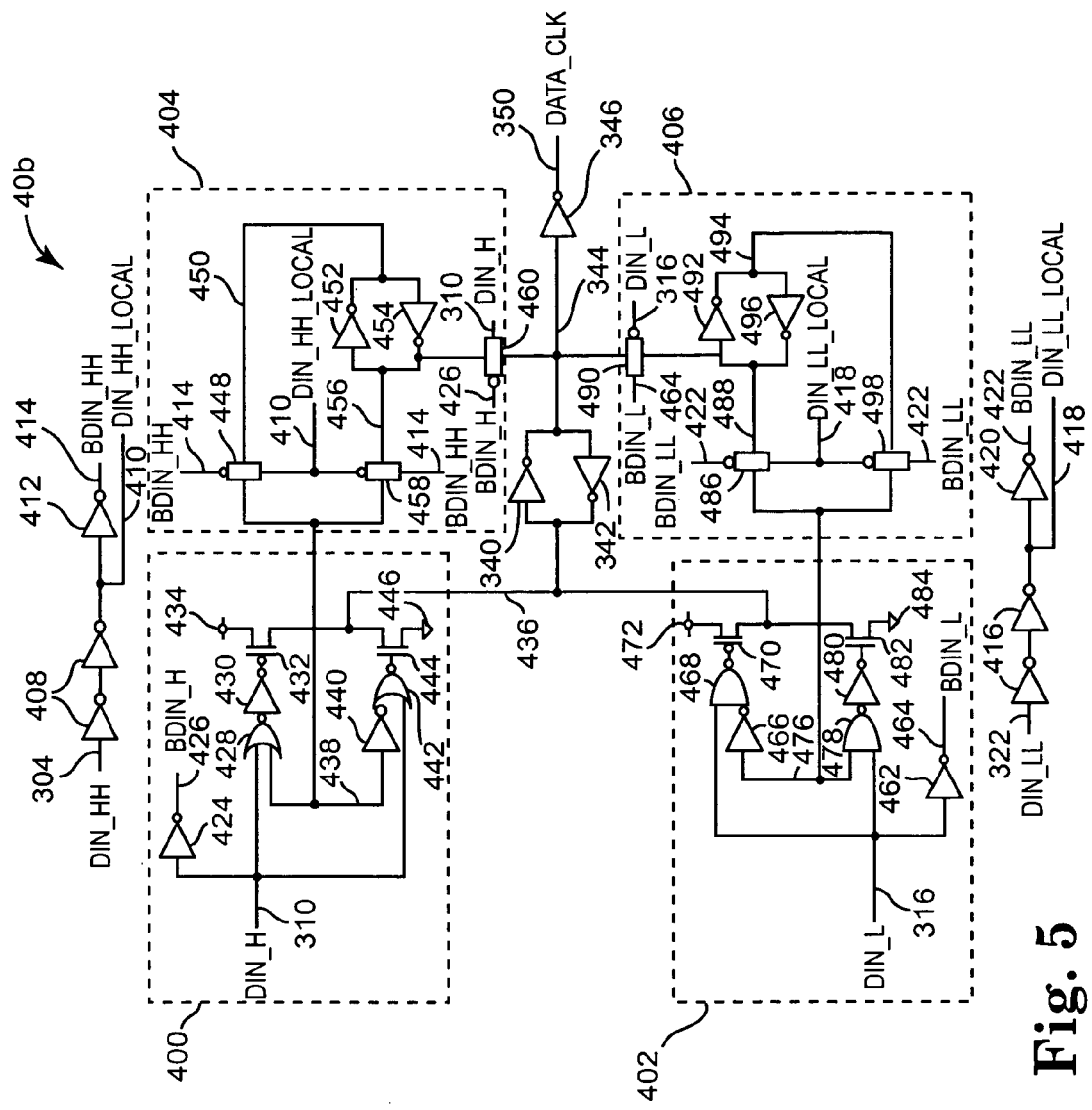
FIG. 5 is a diagram illustrating one embodiment of a portion of a receiver for decoding the clock signal in the chip to chip interface.

FIG. 5 is a diagram illustrating one embodiment of a portion 40b of receiver 40 for decoding the clock signal. The portion 40b of receiver 40 includes inverter chain 408, inverter 412, inverter chain 416, inverter 420, and inverters 340, 342, and 346. The portion 40b of receiver 40 also includes DIN_H toggle circuit 400, DIN_L toggle circuit 402, DIN_HH toggle circuit 404, and DIN_LL toggle circuit 406.

DIN_H toggle circuit 400 toggles the DATA_CLK signal each time a single logic high bit is received in the encoded DDR data signal. DIN_L toggle circuit 402 toggles the DATA_CLK signal each time a single logic low bit is received in the encoded DDR data signal. DIN_HH toggle circuit 404 toggles the DATA_CLK signal each time two or more consecutive logic high bits are received in the encoded DDR data signal and DIN_LL toggle circuit 406 toggles the DATA_CLK signal each time two or more consecutive logic low bits are received in the encoded DDR data signal.

The DIN_HH signal path 304 is electrically coupled to the input of inverter chain 408. The output of inverter chain 408 is electrically coupled to the input of inverter 412 through DIN_HH_LOCAL signal path 410. The output of inverter 412 is electrically coupled to BDIN_HH signal path 414.

The DIN_LL signal path 322 is electrically coupled to the input of inverter chain 416. The output of inverter chain 416 is electrically coupled to the input of inverter 420 through DIN_LL_LOCAL signal path 418. The output of inverter 420 is electrically coupled to BDIN_LL signal path 422.

DIN_H toggle circuit 400 and DIN_L toggle circuit 402 are electrically coupled to the input of inverter 340 and the output of inverter 342 through signal path 436. The output of inverter 340 is electrically coupled to the input of inverter 342, the input of inverter 346, DIN_HH toggle circuit 404, and DIN_LL toggle circuit 406 through signal path 344. The output of inverter 346 is electrically coupled to DATA_CLK signal path 350.

Signal DIN_HH on signal path 304 is input into inverter delay chain 408. Inverter delay chain 408 outputs signal DIN_HH_LOCAL on signal path 410 that is input to inverter 412. Inverter 412 inverts signal DIN_HH_LOCAL and outputs signal BDIN_HH on signal path 414.

Signal DIN_LL on signal path 322 is input into inverter delay chain 416. Inverter delay chain 416 outputs signal DIN_LL_LOCAL on signal path 418 that is input to inverter 420. Inverter 420 inverts signal DIN_LL_LOCAL and outputs signal BDIN_LL on signal path 422.

DIN_H toggle circuit 400 includes inverter 424, NOR gate 428, inverter 430, transistor 432, inverter 440, NOR gate 442, and transistor 444. In one embodiment, transistor 432 is a p-channel metal oxide semiconductor (PMOS) field effect transistor (FET) and transistor 444 is an n-channel metal oxide semiconductor (NMOS) FET.

The DIN_H signal path 310 is electrically coupled to the input of inverter 424, the first input of NOR gate 428, and the second input of NOR gate 442. The output of inverter 424 is electrically coupled to BDIN_H signal path 426. Signal path 438 is electrically coupled to the second input of NOR gate 428 and the input of inverter 440. The output of NOR gate 428 is electrically coupled to the input of inverter 430 and the output of inverter 430 is electrically coupled to the gate of transistor 432. One side of the drain-source path of transistor 432 is electrically coupled to supply voltage 434 and the other side of the drain-source path of transistor 432 is electrically coupled to signal path 436. The output of inverter 440 is electrically coupled to the first input of NOR gate 442. The output of NOR gate 442 is electrically coupled to the gate of transistor 444. One side of the drain-source path of transistor 444 is electrically coupled to reference voltage 446 and the other side of the drain-source path of transistor 444 is electrically coupled to signal path 436. In one embodiment, reference voltage 446 is ground.

Inverter 424 inverts the signal DIN_H on signal path 310 and outputs signal BDIN_H on signal path 426. NOR gate 428 receives signal DIN_H on signal path 310 and a signal from DIN_HH toggle circuit 404 on signal path 438. NOR gate 428 outputs a logic high to inverter 430 if both inputs are logic low, otherwise NOR gate 428 outputs a logic low to inverter 430. Inverter 430 inverts the signal from NOR gate 428 and outputs the inverted signal to the gate of transistor 432. A logic low signal on the gate of transistor 432 turns on transistor 432 and the signal on signal path 436 is pulled to logic high by supply voltage 434. A logic high signal on the gate of transistor 432 turns off transistor 432 and the drain-source path of transistor 432 becomes high impedance.

The signal on signal path 438 is inverted through inverter 440 and provides an input to NOR gate 442. Signal DIN_H on signal path 310 provides another input to NOR gate 442. If both inputs to NOR gate 442 are logic low, the output of NOR gate 442 is a logic high, otherwise the output of NOR gate 442 is a logic low. A logic high signal on the gate of transistor 444 turns on transistor 444 and the signal on signal path 436 is pulled to logic low by reference voltage 446. A logic low signal on the gate of transistor 444 turns off transistor 444 and the drain-source path of transistor 444 becomes high impedance.

DIN_L toggle circuit 402 includes inverter 466, NAND gate 468, transistor 470, NAND gate 478, inverter 480, transistor 482, and inverter 462. In one embodiment, transistor 470 is a PMOS FET and transistor 482 is an NMOS FET.

The DIN_L signal path 316 is electrically coupled to the first input of NAND gate 468, the second input of NAND gate 478, and the input of inverter 462. The output of inverter 462 is electrically coupled to BDIN_L signal path 464. Signal path 476 is electrically coupled to the input of inverter 466 and the first input of NAND gate 478. The output of inverter 466 is electrically coupled to the second input of NAND gate 468. The output of NAND gate 468 is electrically coupled to the gate of transistor 470. One side of the drain-source path of transistor 470 is electrically coupled to supply voltage 472 and the other side of the drain-source path of transistor 470 is electrically coupled to signal path 436. The output of NAND gate 478 is electrically coupled to the input of inverter 480. The output of inverter 480 is electrically coupled to the gate of transistor 482. One side of the drain-source path of transistor 482 is electrically coupled to signal path 436 and the other side of the drain-source path of transistor 482 is electrically coupled to reference voltage 484. In one embodiment, reference voltage 484 is ground.

Inverter 462 inverts signal DIN_L on signal path 316 and outputs signal BDIN_L on signal path 464. NAND gate 478 receives signal DIN_L on signal path 316 and a signal from DIN_LL toggle circuit 406 on signal path 476. NAND gate 478 outputs a logic low to inverter 480 if both inputs are logic high, otherwise NAND gate 478 outputs a logic high to inverter 480. Inverter 480 inverts the signal from NAND gate 478 and outputs the inverted signal to the gate of transistor 482. A logic high signal on the gate of transistor 482 turns on transistor 482 and the signal on signal path 436 is pulled to logic low by reference voltage 484. A logic high signal on the gate of transistor 482 turns off transistor 482 and the drain-source path of transistor 482 becomes high impedance.

The signal on signal path 476 is inverted through inverter 466 and provides an input to NAND gate 468. Signal DIN_L on signal path 316 provides another input to NAND gate 468. If both inputs to NAND gate 468 are logic high, the output of NAND gate 468 is a logic low, otherwise the output of NAND gate 468 is a logic high. A logic low signal on the gate of transistor 470 turns on transistor 470 and the signal on signal path 436 is pulled to logic high by supply voltage 472. A logic high signal on the gate of transistor 470 turns off transistor 470 and the drain-source path of transistor 470 becomes high impedance.

DIN_HH toggle circuit 404 includes transmission gates 448, 458, and 460, and inverters 452 and 454. Transmission gate 448 includes a pair of metal oxide semiconductor field effect transistor (MOSFET) switches, such as one NMOS transistor and one PMOS transistor, connected in parallel. An input signal on signal path 438 or signal path 450 to transmission gate 448 is either conducted through the transmission gate 448 or blocked. Transmission gate 448 is turned on (conducting) to conduct an input signal if a logic high signal is applied to the gate of the active high MOSFET switch and if a logic low signal is applied to the gate of the active low MOSFET switch. Transmission gate 448 is turned off (non-conducting) to block an input signal if a logic low signal is applied to the gate of the active high MOSFET switch and if a logic high signal is applied to the gate of the active low MOSFET switch.

The active low gate of transmission gate 448 is electrically coupled to BDIN_HH signal path 414 and the active high gate of transmission gate 448 is electrically coupled to DIN_HH_LOCAL signal path 410. One side of the data path of transmission gate 448 is electrically coupled to DIN_H toggle circuit 400 through signal path 438 and the other side of the data path is electrically coupled to the output of inverter 452 through signal path 450.

The active high gate of transmission gate 458 is electrically coupled to BDIN_HH signal path 414 and the active low gate of transmission gate 458 is electrically coupled to DIN_HH_LOCAL signal path 410. One side of the data path of transmission gate 458 is electrically coupled to the input of inverter 452 through signal path 456 and the other side of the data path is electrically coupled to DIN_H toggle circuit 400 through signal path 438. In this configuration, one of the transmission gates 448 and 458 is turned on and the other of the transmission gates 448 and 458 is turned off.

The active high gate of transmission gate 460 is electrically coupled to DIN_H signal path 310 and the active low gate of transmission gate 460 is electrically coupled to BDIN_H signal path 426. One side of the data path of transmission gate 460 is electrically coupled to the input of inverter 452 through signal path 456 and the other side of the data path is electrically coupled to the output of inverter 340 through signal path 344. The output of inverter 452 is electrically coupled to the input of inverter 454 through signal path 450 and the output of inverter 454 is electrically coupled to the input of inverter 452 through signal path 456.

The BDIN_HH and DIN_HH_LOCAL signals turn transmission gate 448 on or off. If transmission gate 448 is turned on, the signal on signal path 450 is passed to DIN_H toggle circuit 400 through signal path 438. Transmission gate 458 operates similar to transmission gate 448. The BDIN_HH and DIN_HH_LOCAL signals turn transmission gate 458 on or off. If transmission gate 458 is turned on, the signal on signal path 456 is passed to DIN_H toggle circuit 400 through signal path 438. Transmission gate 460 also operates similar to transmission gate 448. The BDIN_H and DIN_H signals turn transmission gate 460 on or off. If transmission gate 460 is turned on, the signal on signal path 344 is passed to DIN_HH toggle circuit 404 through signal path 456.

Inverters 452 and 454 operate as a latch. Inverter 452 inverts the output signal from inverter 454 and inverter 454 inverts the output signal from inverter 452.

As BDIN_HH transitions to logic low and DIN_HH_LOCAL transitions to logic high, transmission gate 458 turns off and transmission gate 448 turns on. The output signal from inverter 452 passes to the second input of NOR gate 428 and the input of inverter 440. As BDIN_HH transitions to a logic high and DIN_HH_LOCAL transitions to a logic low, transmission gate 448 turns off and transmission gate 458 turns on. The output signal from inverter 454 passes to the second input of NOR gate 428 and the input of inverter 440.

As BDIN_H transitions to a logic low and DIN_H transitions to a logic high, transmission gate 460 turns on and the output of inverter 340 passes to the input of inverter 452. As BDIN_H transitions to a logic high and DIN_H transitions to a logic low, transmission gate 460 turns off and the output of inverter 340 is latched into inverters 452 and 454.

DIN_LL toggle circuit 406 includes transmission gates 490, 486 and 498, and inverters 492 and 496. The active low gate of transmission gate 490 is electrically coupled to DIN_L signal path 316 and the active high gate of transmission gate 490 is electrically coupled to BDIN_L signal path 464. One side of the data path of transmission gate 490 is electrically coupled to the output of inverter 340 through signal path 344 and the other side of the data path is electrically coupled to the input of inverter 492 through signal path 488.

The active low gate of transmission gate 486 is electrically coupled to BDIN_LL signal path 422 and the active high gate of transmission gate 486 is electrically coupled to DIN_LL_LOCAL signal path 418. One side of the data path of transmission gate 486 is electrically coupled to the output of inverter 496 through signal path 488 and the other side of the data path is electrically coupled to DIN_L toggle circuit 402 through signal path 476.

The active low gate of transmission gate 498 is electrically coupled to DIN_LL_LOCAL signal path 418 and the active high gate of transmission gate 498 is electrically coupled to BDIN_LL signal path 422. One side of the data path of transmission gate 498 is electrically coupled to the output of inverter 492 through signal path 494 and the other side of the data path is electrically coupled to DIN_L toggle circuit 402 through signal path 476. The output of inverter 492 is electrically coupled to the input of inverter 496 through signal path 494 and the output of inverter 496 is electrically coupled to the input of inverter 492 through signal path 488.

Transmission gate 490 operates similar to transmission gate 448. The BDIN_L and DIN_L signals turn transmission gate 490 on or off. If transmission gate 490 is turned on, the signal on signal path 344 is passed to DIN_LL toggle circuit 406 through signal path 488. Transmission gate 486 also operates similar to transmission gate 448. The BDIN_LL and DIN_LL_LOCAL signals turn transmission gate 486 on or off. If transmission gate 486 is turned on, the signal on signal path 488 is passed to DIN_L toggle circuit 402 through signal path 476. In addition, transmission gate 498 operates similar to transmission gate 448. The BDIN_LL and DIN_LL_LOCAL signals turn transmission gate 498 on or off. If transmission gate 498 is turned on, the signal on signal path 494 is passed to DIN_L toggle circuit 402 through signal path 476.

Inverters 492 and 496 operate as a latch. Inverter 492 inverts the output signal from inverter 496 and inverter 496 inverts the output signal from inverter 492.

As BDIN_LL transitions to a logic low and DIN_LL_LOCAL transitions to a logic high, transmission gate 498 turns off and transmission gate 486 turns on. The output signal from inverter 496 passes to the first input of NAND gate 478 and the input of inverter 466. As BDIN_LL transitions to a logic high and DIN_HH_LOCAL transitions to a logic low, transmission gate 486 turns off and transmission gate 498 turns on. The output signal from inverter 492 passes to the first input of NAND gate 478 and the input of inverter 466.

As BDIN_L transitions to a logic high and DIN_L transitions to a logic low, transmission gate 490 turns on and the output of inverter 340 passes to the input of inverter 492. As BDIN_L transitions to a logic low and DIN_L transitions to a logic high, transmission gate 490 turns off and the output of inverter 340 is latched into inverters 492 and 496.

Inverters 340 and 342 operate as a latch. Inverter 340 inverts the output signal from inverter 342 and inverter 342 inverts the output signal from inverter 340. Inverter 346 inverts the output signal from inverter 340 and provides the DATA_CLK signal.

Signal DT includes four possible data transitions. The first possible data transition is from a logic low to a logic high. The second possible data transition is from a logic high to a logic low. The third possible data transition is from a logic high to a logic high and the fourth possible data transition is from a logic low to a logic low.

For a logic low to a logic high transition, signal DIN_LL is a logic low or transitions to a logic low, signals DIN_L and DIN_H transition to a logic low, and DIN_HH remains at a logic high. As signal DIN_L transitions to a logic low, the output of NAND gate 468 transitions to a logic high, resulting in the drain-source path of transistor 470 becoming high impedance. At the same time, the output of NAND gate 478 transitions to a logic high and is inverted through inverter 480, resulting in the drain-source path of transistor 482 becoming high impedance. Transmission gate 486 is turned off and transmission gates 490 and 498 are turned on. Transmission gates 490 and 498 pass the signal on signal path 344 to inverter 492. The output signal from inverter 492 is passed to an input of NAND gate 478 and the input of inverter 466.

Transmission gates 458 and 460 are turned off and transmission gate 448 is turned on. As signal DIN_H transitions to a logic low, either transistor 432 or transistor 444 is turned on depending upon the logic level of the signal on signal path 438 from the output of inverter 452. If the output of inverter 452 is a logic high, a logic high signal is provided to the gate of transistor 432 and the drain-source path of transistor 432 becomes high impedance. Both inputs to NOR gate 442 are logic low and the output of NOR gate 442 provides a logic high signal to the gate of transistor 444 that turns on transistor 444. The signal on signal path 436 is pulled to a logic low by reference voltage 446.

If the output of inverter 452 is a logic low, the drain-source path of transistor 444 becomes high impedance. Both inputs to NOR gate 428 are logic low and the output of NOR gate 428 provides a logic high output to inverter 430. The output of inverter 430 provides a logic low signal to the gate of transistor 432 turning on transistor 432. The signal on signal path 436 is pulled to a logic high by supply voltage 434. The signal on signal path 436 is latched into inverters 340 and 346 and provided on signal path 350 at the DATA_CLK signal.

For a logic high to a logic high transition, signals DIN_LL, DIN_L, and DIN_H are logic low, and signal DIN_HH transitions to a logic low. Transmission gate 460 remains turned off, transmission gate 448 turns off, and transmission gate 458 turns on. As transmission gate 458 turns on, the signal on signal path 438 changes from a logic high to a logic low or from a logic low to a logic high. As signal DIN_H is a logic low, transistor 432 turns on if transistor 444 turned on for the prior logic high signal and transistor 444 turns on if transistor 432 turned on for the prior logic high signal. The signal on signal path 436 and the DATA_CLK signal change logic levels. The DATA_CLK signal toggles for each additional logic high signal as DIN_HH toggles from a logic low to a logic high or from a logic high to a logic low for each additional logic high signal. The logic level of the signal on signal path 438 toggles in response to the toggling of DIN_HH, which alternately toggles transmission gates 448 and 458 on and off.

For a logic high to a logic low transition, signal DIN_HH is a logic high or transitions to a logic high, signals DIN_H and DIN_L transition to a logic high, and DIN_LL remains at a logic low. As signal DIN_H transitions to a logic high, the output of NOR gate 428 transitions to a logic low. The output of NOR gate 428 is inverted through inverter 430 and provided to the gate of transistor 432, resulting in the drain-source path of transistor 432 becoming high impedance. At the same time, the output of NOR gate 442 transitions to a logic low providing a logic low to the gate of transistor 444, resulting in the drain-source path of transistor 444 becoming high impedance. Transmission gate 458 is turned off and transmission gates 448 and 460 are turned on. Transmission gates 460 passes the signal on signal path 344 to inverter 452. Transmission gate 448 passes the output of inverter 452 to an input of NOR gate 428 and the input of inverter 440.

Transmission gates 486 and 490 are turned off and transmission gate 498 is turned on. As transmission gate 490 is turned off, the logic level on signal path 344, which is the inverse of the DATA_CLK signal, is latched into inverters 492 and 496. With transmission gate 498 turned on, the logic level of the DATA_CLK signal is passed to the input of inverter 466 and an input of NAND gate 478. As signal DIN_L transitions to logic high, either transistor 470 or transistor 482 is turned on depending upon the logic level of the signal on signal path 476 from the output of inverter 492. If the output of inverter 492 and the DATA_CLK signal are at logic high, both inputs to NAND gate 478 are logic high, and the output of NAND gate 478 provides a logic low to inverter 480. The output of inverter 480 provides a logic high signal to the gate of transistor 482 turning transistor 482 on. The signal on signal path 436 is pulled to a logic low by reference voltage 484 to toggle the DATA_CLK signal from a logic high to a logic low. If the output of inverter 492 and the DATA_CLK signal are at a logic low, both inputs to NAND gate 468 are logic high, and the output of NAND gate 468 provides a logic low signal to the gate of transistor 470 turning on transistor 470. The signal on signal path 436 is pulled to a logic high by supply voltage 472 to toggle the DATA_CLK signal from a logic low to a logic high. The signal on signal path 436 toggles the logic level of the DATA_CLK signal as the signal is inverted by inverters 340 and 346.

For a logic low to a logic low transition, signals DIN_HH, DIN_H, and DIN_L are logic high, and signal DIN_LL transitions to a logic high. Transmission gate 490 remains turned off, transmission gate 498 turns off, and transmission gate 486 turns on. As transmission gate 486 turns on, the signal on signal path 476 transitions from a logic high to a logic low or from a logic low to a logic high. As signal DIN_L is a logic high, transistor 470 turns on if transistor 482 turned on for the prior logic low signal and transistor 482 turns on if transistor 470 turned on for the prior logic low signal. The signal on signal path 436 and the DATA_CLK signal toggle logic levels. The DATA_CLK signal continues to toggle for each additional logic low signal as DIN_LL toggles for each additional logic low signal. The logic level of the signal on signal path 476 toggles in response to the toggling of DIN_LL, which alternately toggles transmission gates 486 and 498 on and off.

For a logic low to a logic high transition, transmission gate 460 is turned off. The logic level on signal path 344, which is the inverse of the DATA_CLK signal, is latched into inverters 452 and 454. With transmission gate 448 turned on, the logic level of the DATA_CLK signal is passed to the input of inverter 440 and an input of NOR gate 428.

Figure 6:
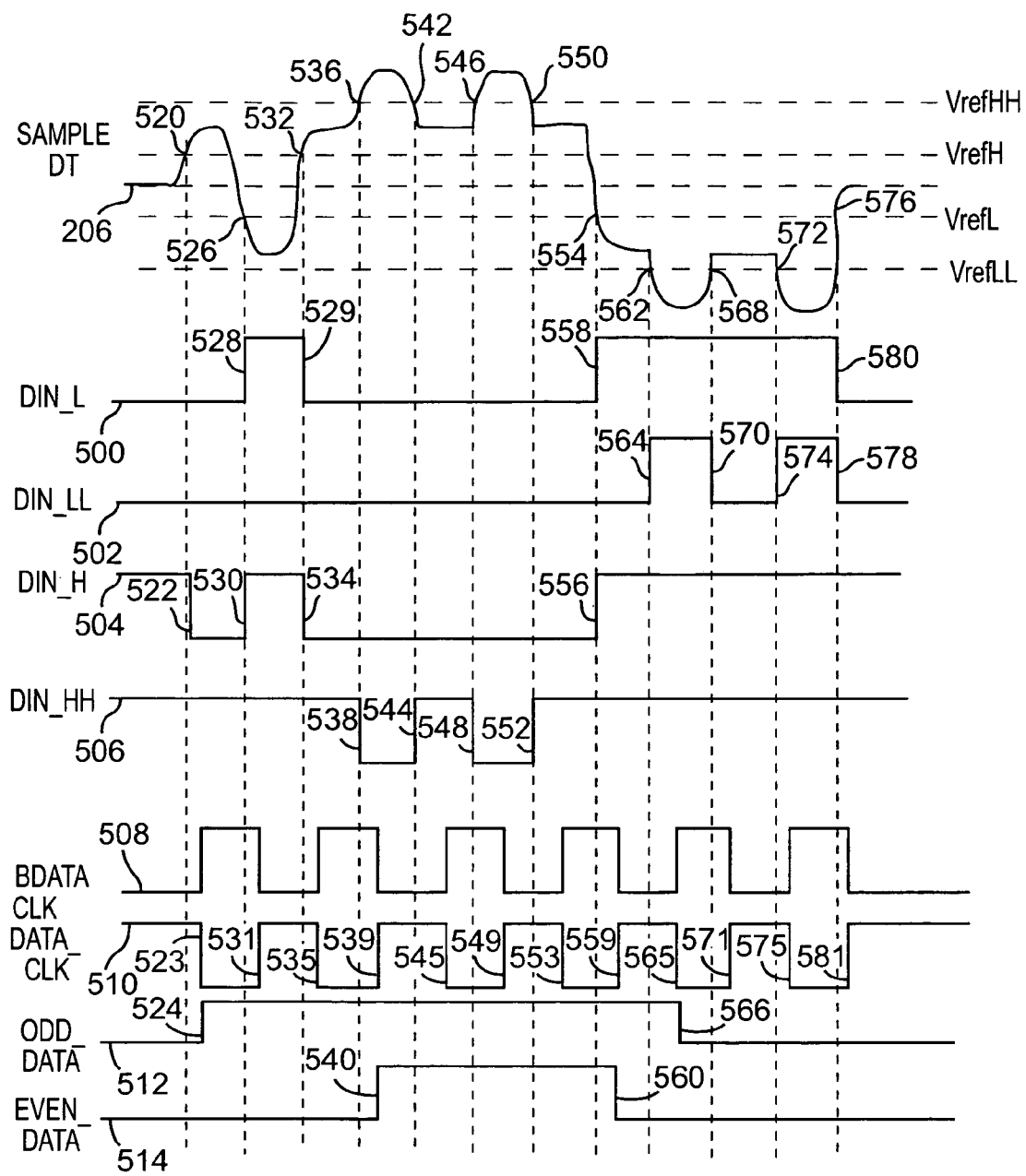
FIG. 6 is a timing diagram illustrating the timing of signals for the receiver for the chip to chip interface.

FIG. 6 is a timing diagram illustrating the timing of signals for receiver 40. The timing diagram illustrates sample DT signal 206 on signal path 150, DIN_L signal 500 on signal path 316, DIN_LL signal 502 on signal path 322, DIN_H signal 504 on signal path 310, DIN_HH signal 506 on signal path 304, BDATA_CLK signal 508 on signal path 354, DATA_CLK signal 510 on signal path 350, ODD_DATA signal 512 on signal path 330, and EVEN_DATA signal 514 on signal path 334.

To begin, DATA_CLK signal 510 is a logic high. As sample DT signal 206 transitions above VREFH at 520, DIN_H signal 504 transitions to a logic low at 522, which toggles DATA_CLK signal 510 to a logic low at 523. With DIN_H and DIN_L both logic low, ODD_DATA signal 512 transitions to a logic high at 524 on the rising edge of BDATA_CLK signal 508. As sample DT signal 206 transitions below VREFL at 526, DIN_L signal 500 transitions to a logic high at 528 and DIN_H signal 504 transitions to a logic high at 530, which toggles DATA_CLK signal 510 to a logic high at 531. EVEN_DATA signal 514 does not transition as EVEN_DATA signal 514 is already at a logic low. As sample DT signal 206 transitions above VREFH at 532, DIN_L signal 500 transitions to a logic low at 529 and DIN_H signal 504 transitions to a logic low at 534, which toggles DATA_CLK signal 510 at 535. ODD_DATA signal 512 does not transition as ODD_DATA signal 512 is already at a logic high.

Next, as sample DT signal 206 transitions above VREFHH at 536, DIN_HH signal 506 transitions to a logic low at 538, which toggles DATA_CLK signal 510 to a logic high at 539. With DIN_H and DIN_L both logic low, EVEN_DATA signal 514 transitions to a logic high at 540 on the rising edge of DATA_CLK signal 510. As sample DT signal 206 transitions below VREFHH at 542, DIN_HH signal 506 transitions to a logic high at 544, which toggles DATA_CLK signal 510 at 545. As sample DT signal 206 transitions above VREFHH at 546, DIN_HH signal 506 transitions to a logic low at 548, which toggles DATA_CLK signal 510 at 549. As sample DT signal 206 transitions below VREFHH at 550, DIN_HH signal 506 transitions to a logic high at 552, which toggles DATA_CLK signal 510 at 553. ODD_DATA signal 512 and EVEN_DATA signal 514 remain at a logic high between DATA_CLK signal 510 edges 539 and 559.

As sample DT signal 206 transitions below VREFL at 554, DIN_H signal 504 transitions to a logic high at 556 and DIN_L signal 500 transitions to a logic high at 558, which toggles DATA_CLK signal 510 at 559. With DIN_H and DIN_L both logic high, EVEN_DATA signal 514 transitions to a logic low at 560 on the rising edge of DATA_CLK signal 510. As sample DT signal 206 transitions below VREFLL at 562, DIN_LL signal 502 transitions to a logic high at 564, which toggles DATA_CLK signal 510 at 565. With DIN_L and DIN_H both logic high, ODD_DATA signal 512 transitions to a logic low at 566 on the rising edge of BDATA_CLK signal 508.

As sample DT signal 206 transitions above VREFLL at 568, DIN_LL signal 502 transitions to a logic low at 570, which toggles DATA_CLK signal 510 at 571. As sample DT signal 206 transitions below VREFLL at 572, DIN_LL signal 502 transitions to a logic high at 574, which toggles DATA_CLK signal 510 at 575. As sample DT signal 206 transitions above VREFL at 576, DIN_LL signal 502 transitions to a logic low at 578 and DIN_L signal 500 transitions to a logic low at 580, which toggles DATA_CLK signal 510 at 581. ODD_DATA signal 512 and EVEN_DATA signal 514 remain at a logic low between DATA_CLK signal 510 edges 565 and 581.

What is claimed is:

1. A chip to chip interface comprising:
a driver configured to receive a data signal and provide an output signal at a first level in response to receiving an odd number of consecutive logic highs in the data signal, at a second level in response to receiving an odd number of consecutive logic lows in the data signal, at a third level in response to receiving an even number of consecutive logic highs in the data signal and at a fourth level in response to receiving an even number of consecutive logic lows in the data signal.

2. The chip to chip interface of claim 1, comprising a receiver configured to receive the output signal and provide a clock signal and data from the data signal.

3. The chip to chip interface of claim 2, wherein the receiver is configured to provide the data as even data and odd data.

4. The chip to chip interface of claim 2, wherein the clock signal is a 500 MHz clock signal and the data signal is a 1 GHz double data rate data signal.

5. The chip to chip interface of claim 1, comprising a receiver configured to compare the output signal to four reference levels to provide data from the data signal.

6. The chip to chip interface of claim 1, comprising a receiver configured to compare the output signal to four reference levels to provide a clock signal.

7. The chip to chip interface of claim 1, wherein the fourth level is less than the second level that is less than the first level that is less than the third level.

8. The chip to chip interface of claim 1, comprising a receiver configured to toggle a data clock signal in response to each transition in the output signal.

9. The chip to chip interface of claim 8, wherein the data clock signal latches data from the data signal.

10. The chip to chip interface of claim 1, wherein the data signal is a double data rate data signal.

11. A chip to chip interface comprising:
a driver configured to encode a data signal and a clock signal into an encoded signal by driving the encoded signal to a first reference level at a first edge of the clock signal in response to a logic low to a logic high transition in the data signal, driving the encoded signal to a second reference level at a second edge of the clock signal in response to a logic high to a logic low transition in the data signal, driving the encoded signal to a third reference level at a third edge of the clock signal in response to no change in the data signal if the encoded signal was at the first reference level, and driving the encoded signal to a fourth reference level at a fourth edge of the clock signal in response to no change in the data signal if the encoded signal was at the second reference level; and
a receiver configured to receive the encoded signal.

12. The chip to chip interface of claim 11, wherein the driver is configured to drive the encoded signal to the first reference level at a fifth edge of the clock signal in response to no change in the data signal if the encoded signal was at the third reference level.

13. The chip to chip interface of claim 11, wherein the driver is configured to drive the encoded signal to the second reference level at a fifth edge of the clock signal in response to no change in the data signal if the encoded signal was at the fourth reference level.

14. The chip to chip interface of claim 11, wherein the second reference level is less than the first reference level, and the third reference level is greater than the first reference level, and the fourth reference level is less than the second reference level.

15. A chip to chip interface comprising:
means for providing an encoded signal comprising a clock signal and a double data rate data signal on a single signal path; and
means for decoding the encoded signal to recreate the clock signal and obtain data from the double data rate data signal,
wherein the means for providing an encoded signal comprises means for providing the encoded signal at a first level in response to a change in the double data rate data signal from a low level to a high level, at a second level in response to a change in the double data rate data signal from a high level to a low level, at a third reference level in response to consecutive high levels in the double data rate data signal, and at a fourth reference level in response to consecutive low levels in the double data rate data signal.

16. A chip to chip interface comprising:
means for providing an encoded signal comprising a clock signal and a double data rate data signal on a single signal path; and
means for decoding the encoded signal to recreate the clock signal and obtain data from the double data rate data signal,
wherein the means for decoding the encoded signal comprises means for toggling a data clock signal at each transition of the encoded signal.

17. A method of passing data and a clock signal between chips comprising:
driving a signal to a first level at a first edge of the clock signal to indicate a change in a data stream from a logic low to a logic high;
driving the signal to a second level at a second edge of the clock signal to indicate a change in the data stream from a logic high to a logic low;
driving the signal to a third reference level at a third edge of the clock signal to indicate consecutive logic highs in the data stream; and
driving the signal to a fourth reference level at a fourth edge of the clock signal to indicate consecutive logic lows in the data stream.

18. The method of claim 17, comprising:
driving the signal alternately between the first level and the third level at consecutive edges of the clock signal to indicate more than two consecutive logic highs in the data stream; and
driving the signal alternately between the second level and the fourth level at consecutive edges of the clock signal to indicate more than two consecutive logic lows in the data stream.

19. The method of claim 17, comprising:
comparing the signal to a plurality of reference levels to determine the data stream.

20. The method of claim 19, wherein the plurality of reference levels comprises four reference levels.

21. The method of claim 19, comprising:
toggling a data clock signal at each transition of the signal.

* * * * *